United States Patent
Hermann

(10) Patent No.: US 7,705,581 B2
(45) Date of Patent: Apr. 27, 2010

(54) ELECTRONIC DEVICE AND METHOD FOR ON CHIP JITTER MEASUREMENT

(75) Inventor: Franz Hermann, Fahrenzhausen (DE)

(73) Assignee: Texas Instruments Incorporated, Dallas, TX (US)

( * ) Notice: Subject to any disclaimer, the term of this patent is extended or adjusted under 35 U.S.C. 154(b) by 85 days.

(21) Appl. No.: 12/134,369

(22) Filed: Jun. 6, 2008

(65) Prior Publication Data
US 2008/0309319 A1    Dec. 18, 2008

Related U.S. Application Data

(60) Provisional application No. 60/016,696, filed on Dec. 26, 2007.

(51) Int. Cl.
*G01R 23/12* (2006.01)
*H03L 7/06* (2006.01)

(52) U.S. Cl. .................. 324/76.53; 327/147

(58) Field of Classification Search ............. 324/76.53, 324/76.52, 76.39, 76.11, 613, 76.19, 622, 324/76.77, 765; 327/156, 155, 144, 146, 327/147, 376, 327; 375/215, 294, 224, 226, 375/371, 373; 702/106, 108, 117, 69, 72
See application file for complete search history.

(56) References Cited

U.S. PATENT DOCUMENTS

| | | | |
|---|---|---|---|
| 6,208,169 B1 | 3/2001 | Wong et al. | |
| 6,397,042 B1 | 5/2002 | Prentice et al. | |
| 6,768,954 B2 | 7/2004 | Niijima | |
| 2004/0128591 A1 | 7/2004 | Ihs et al. | |
| 2005/0024037 A1 | 2/2005 | Fetzer | |
| 2005/0193290 A1* | 9/2005 | Cho et al. | 714/710 |
| 2006/0076997 A1* | 4/2006 | Ogasawara | 327/291 |
| 2007/0274425 A1* | 11/2007 | Werker | 375/376 |
| 2007/0285178 A1* | 12/2007 | Werker | 331/16 |

FOREIGN PATENT DOCUMENTS

| | | |
|---|---|---|
| DE | 10197038 B4 | 1/2008 |
| EP | 0889411 A2 | 1/1999 |

* cited by examiner

*Primary Examiner*—Hoai-An D Nguyen
(74) *Attorney, Agent, or Firm*—Yingsheng Tung; Wade J. Brady, III; Frederick J. Telecky, Jr.

(57) ABSTRACT

The present invention relates to an integrated electronic device for digital signal processing, which includes a reference clock input for receiving a reference clock, a phase locked loop (PLL), a phase interpolator (PI) coupled to the phase locked loop (PLL) for shifting a phase of an output clock signal of the PLL in a stepwise manner so as to generate a shifted output clock signal (PHI_out), a logic stage for determining the state of the reference clock signal (REF_CLK) multiple times during an edge of the shifted output clock for each phase shift, a storing means for storing information whether or not the determined state of the reference clock signal (REF_CLK) is stable for a phase of the shifted output clock signal (PHI_out), and an interface configured to read out the stored information for determining the jitter of the shifted output clock signal (PHI_OUT).

4 Claims, 1 Drawing Sheet

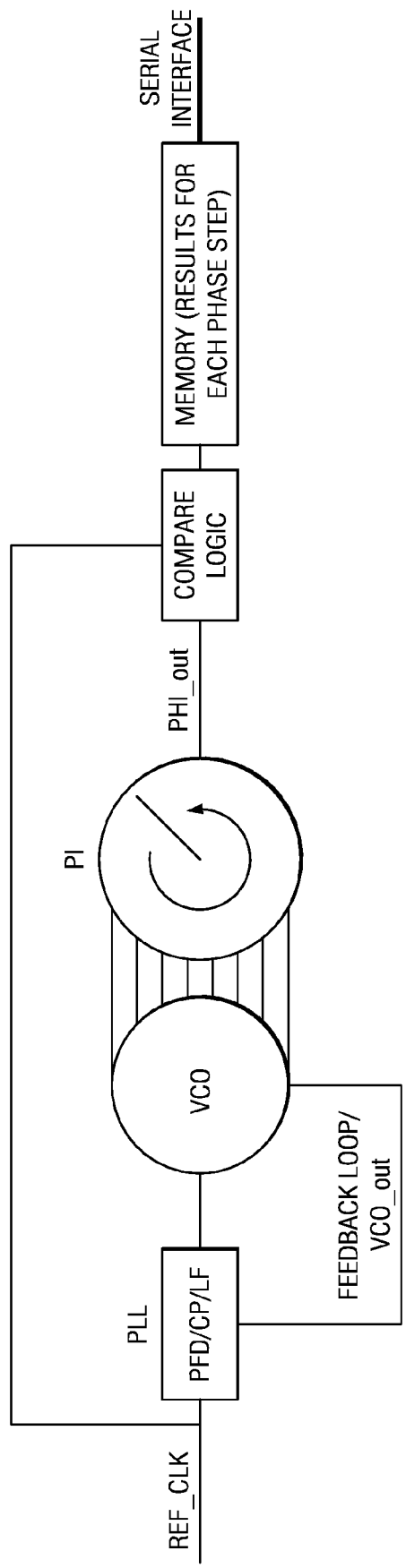

ELECTRONIC DEVICE AND METHOD FOR ON CHIP JITTER MEASUREMENT

This application claims priority from German Patent Application No. 10 2007 027 070.6 filed Jun. 12, 2007 and from U.S. Provisional Patent Application No. 61/016,696 filed Dec. 26, 2007.

FIELD OF THE INVENTION

The present invention generally relates to an integrated electronic device for digital signal processing. More particularly, the present invention relates to measurement of phase jitter of a reference clock in a phase-locked loop (PLL) circuit.

BACKGROUND OF THE INVENTION

Semiconductor automated test equipment (ATE) is widely used for testing components of integrated circuits. To measure the jitter of a clock signal using ATE, the ATE has to provide a precision time measurement system or a repeatable signal edge placement. Generally all time measurement units that can measure the time period can also measure PLL jitter. The accuracy depends on the repeatability and precision of the time measurement unit. It is also possible to measure jitter by analyzing edge placement results. In this case, the accuracy depends on the edge placement resolution and on the edge placement repeatability.

However, sometimes the time measurement system in an ATE is not accurate enough to measure jitter in the low ps range, or there is even no time measurement system available on the ATE. If an ATE does have a time measurement system, it is often the case that there is just one time measurement system that has to be shared between sites for multi-site testing, which makes multi-site testing difficult. Furthermore, on some test systems it is not possible to control edge placement timing precisely and often the accuracy of edge placement is not accurate enough for jitter measurement. Systems having an accurate time measurement system or an accurate edge placement are usually very expensive and often the specified load for the device is not the same as the impedance of the measurement system. This can add jitter and influence the measurement results.

SUMMARY OF THE INVENTION

It is an object of the present invention to provide a test measurement system that is accurate, low cost, high precision, and can be used for multi-site testing.

The present invention provides an integrated electronic device for digital signal processing. The device comprises a reference clock input for receiving a reference clock and a phase locked loop. A phase interpolator coupled to the phase locked loop (PLL) is configured to shift a phase of an output clock signal of the PLL in a stepwise manner so as to generate a shifted output clock signal. A logic stage then determines the state of the reference clock signal multiple times during an edge of the shifted output clock for each phase shift, a storing means stores information on whether or not the determined state of the reference clock signal is stable for a phase of the shifted output clock signal, and an interface reads out the stored information for determining the jitter of the shifted output clock signal. The phase of the PLL output clock signal can be shifted in small steps (from 0° to 360°) using the phase interpolator. On each phase interpolator step, the signal state is compared to see if the logic level is high or low. The low/high compare can be done on each step multiple times, as often as the specification of the device under test requires. Thus no external measurement device is required, which means that the present invention provides a low-cost solution that is at the same time accurate with high precision, and can be used for multi-site testing.

Preferably, the device comprises storing means for storing a first logic value if the state of the reference clock signal is the same for all the multiple measurements relating to one phase of the shifted output clock signal, and storing means for storing a second logic value if the state of the reference clock signal is not the same for all the multiple measurements relating to one phase of the shifted output clock signal.

If the logic compare result is that the reference clock signal is stable low or high, the first logic value, for example 0, can be stored in the storing means. However, if the logic compare result is that the reference clock signal is unstable, the second logic value, for example 1, can be stored in the storing means. This can be done for each phase interpolator step from 0° to 360°. The interface can be a serial interface, which reads out the bit pattern stored in the storing means and calculates jitter values of the shifted output clock signal. Using a serial interface means that the jitter values can be read out via a serial bus.

The present invention also provides a method for determining the jitter of a phase locked loop. The method comprises generating a clock signal by a phase locked loop in an integrated circuit, generating a shifted output clock signal having a plurality of phases spanning a period of the clock signal, determining the state of a reference clock signal during the edges of the shifted output clock signal multiple times for each phase of the shifted output signal, storing a first logic value if the state of the reference clock signal is the same for all the multiple measurements relating to one phase of the shifted output clock signal, storing a second logic value if the state of the reference clock signal is not the same for all the multiple measurements relating to one phase of the shifted output clock signal, and determining the phase jitter of the shifted output clock signal of the PLL based on the second logic values.

This method allows the phase jitter of the shifted output clock signal to be measured without an external measurement, which provides the advantages of an on-chip test measurement system that is accurate, high precision, and can be used for multi-site testing, whilst at the same time being inexpensive to employ.

Further advantages and characteristics of the invention ensue from the description below of a preferred embodiment, and from the accompanying drawing.

BRIEF DESCRIPTION OF THE DRAWING

The FIGURE is a simplified schematic diagram of an integrated electronic device for digital signal processing according to the invention.

DETAILED DESCRIPTION OF THE EMBODIMENT

The FIGURE shows a simplified schematic block diagram of an integrated electronic device. A reference clock input is configured to receive a reference clock signal REF_CLK. The reference clock input is connected to the input of a phase-locked loop circuit PLL. The phase-locked loop PLL comprises the standard components of an analog phase-locked loop circuit for generating a clock signal, including a phase frequency detector PFD, a charge pump CP and a loop filter LF, as well as a voltage controlled oscillator VCO, which has one output connected back in a feedback loop to an input of the phase-locked loop PLL. The output of the phase-locked loop PLL, i.e., the output of the voltage controlled oscillator VCO, is coupled to a phase interpolator PI, the output of which is connected to a logic analysis module. The logic analysis module is connected to a memory and also to the reference clock input. A serial interface is provided at the output of the memory for reading information stored in the memory.

In operation, the phase locked loop PLL receives the reference clock signal REF_CLK at its input and generates a clock signal. In the figure, it is schematically shown that the output of the voltage controlled oscillator VCO has 8 fixed output phases. The phase interpolator PI then shifts the phase of the output clock signal of the phase-locked loop PLL in small steps from 0-360°. The phase interpolator PI generates a shifted output clock signal PHI_OUT having a plurality of phases spanning a period of the clock signal. At each phase interpolator step, i.e., at each step of shifting the clock signal output from the phase-locked loop PLL by the phase interpolator PI, the state of the reference clock signal REF_CLK is determined by the logic analysis module during the edges of the shifted output clock signal PHI_OUT. The logic analysis module determines whether the logic level of the reference clock signal REF_CLK is low or high. Determination of the state of the reference clock signal REF_CLK is carried out at multiple times for each phase of the shifted output signal. The number of times it is required to determine the state of the reference clock signal REF_CLK on each phase interpolator step is defined by the specification of the device under test.

If it is determined by the logic analysis module that the state of the reference clock REF_CLK is the same for all the multiple measurements relating to one phase of the shifted output clock signal PHI_OUT (stable low or high), then, for example, a 0 is stored in the memory. If the state of the reference clock signal REF_CLK is not the same for all the multiple measurements relating to one phase of the shifted output clock signal PHI_OUT, and thus unstable, a 1 is stored in the memory. This is carried out for each phase interpolator step (0° to 360°).

The bit pattern is stored in the memory and the bit pattern information is read out by the serial interface. To calculate the phase jitter of the shifted output clock signal PHI_OUT, the count from the first unstable state of the reference clock REF_CLK (the first 1 stored in the memory) to the last unstable state of the reference clock REF_CLK (the last 1 stored in the memory) is multiplied by the interpolator step width. The maximum resolution of the phase jitter calculation is determined by the phase interpolator step width and the reference clock signal REF_CLK must have a lower jitter than the shifted clock signal PHI_OUT output from the phase interpolator PI.

To measure phase jitter of the PLL, the reference clock REF_CLK must have a lower jitter than the shifted output clock signal PHI_OUT. If the PLL works as a jitter cleaner, and therefore the phase jitter of the shifted output clock signal PHI_OUT is lower than that of the reference clock signal REF_CLK, then the phase jitter of the reference clock REF_CLK can be measured.

Although the present invention has been described with reference to a specific embodiment, it is not limited to this embodiment and no doubt further alternatives will occur to the skilled person that lie within the scope of the invention as claimed.

What is claimed is:

1. An integrated electronic device for digital signal processing comprising:
    a reference clock input for receiving a reference clock;
    a phase locked loop (PLL);
    a phase interpolator (PI) coupled to the phase locked loop (PLL) for shifting a phase of an output clock signal of the PLL in a stepwise manner so as to generate a shifted output clock signal (PHI_out);
    a logic stage for determining the state of the reference clock signal (REF_CLK) multiple times during an edge of the shifted output clock for each phase shift;
    a storing means for storing information whether or not the determined state of the reference clock signal (REF_CLK) is stable for a phase of the shifted output clock signal (PHI_out); and
    an interface configured to read out the stored information for determining the jitter of the shifted output clock signal (PHI_OUT).

2. The integrated electronic device according to claim 1, wherein the storage means further comprises means for storing a first logic value if the state of the reference clock signal is the same for all the multiple measurements relating to one phase of the shifted output clock signal; and means for storing a second logic value if the state of the reference clock signal is not the same for all the multiple measurements relating to one phase of the shifted output clock signal.

3. The integrated electronic device according to claim 1, wherein the interface is a serial interface.

4. A method for determining the jitter of a phase locked loop comprising:
    generating a clock signal with a phase locked loop in an integrated circuit;
    generating a shifted output clock signal having a plurality of phases spanning a period of the clock signal;
    determining the state of a reference clock signal during the edges of the shifted output clock signal multiple times for each phase of the shifted output signal;
    storing a first logic value if the state of the reference clock signal is the same for all the multiple measurements relating to one phase of the shifted output clock signal; or
    storing a second logic value if the state of the reference clock signal is not the same for all the multiple measurements relating to one phase of the shifted output clock signal; and
    determining the phase jitter of the shifted output clock signal of the PLL based on the second logic values.

* * * * *